(12) United States Patent
Ono

(10) Patent No.: US 10,998,206 B2
(45) Date of Patent: May 4, 2021

(54) LIGHT IRRADIATION TYPE HEAT TREATMENT APPARATUS

(71) Applicant: SCREEN HOLDINGS CO., LTD., Kyoto (JP)

(72) Inventor: Yukio Ono, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/440,431

(22) Filed: Jun. 13, 2019

(65) Prior Publication Data
US 2019/0393054 A1    Dec. 26, 2019

(30) Foreign Application Priority Data

Jun. 20, 2018 (JP) ............................. JP2018-116647

(51) Int. Cl.
*H01L 21/67* (2006.01)
*H01L 21/687* (2006.01)
(Continued)

(52) U.S. Cl.
CPC ........ *H01L 21/67115* (2013.01); *H01J 61/16* (2013.01); *H01J 61/90* (2013.01);
(Continued)

(58) Field of Classification Search
CPC ............. H01L 21/324; H01L 21/67115; H01L 21/67248; H01L 21/68714; H01L 22/20
See application file for complete search history.

(56) References Cited

U.S. PATENT DOCUMENTS 4,542,711 A * 9/1985 Izu .................... C23C 16/545
                                                        118/50.1
5,249,865 A    10/1993 Paranjpe et al.
(Continued)

FOREIGN PATENT DOCUMENTS

JP    2008-541133 A    11/2008
JP    2017-092102 A    5/2017
(Continued)

OTHER PUBLICATIONS

Taiwanese Office Action issued in corresponding Taiwanese Patent Application No. 108117641, dated Mar. 23, 2020, with English translation of the Japanese translation of the Taiwanese Office Action.
(Continued)

*Primary Examiner* — Jaehwan Oh
(74) *Attorney, Agent, or Firm* — McDermott Will & Emery LLP

(57) ABSTRACT

Prior to heat treatment of a semiconductor wafer to be treated, a dummy wafer is placed on a susceptor made of quartz, and the susceptor is preheated by irradiation with light from halogen lamps. A controller controls an output from the halogen lamps, based on the temperature of the susceptor measured with a radiation thermometer. The radiation thermometer receives infrared radiation of a wavelength longer than 4 μm to measure the temperature of the susceptor. The radiation thermometer is able to receive only infrared radiation emitted from the susceptor to accurately measure the temperature of the susceptor, regardless of whether or not a wafer is held by the susceptor, because quartz is opaque in a wavelength range longer than 4 μm.

2 Claims, 8 Drawing Sheets

(51) Int. Cl.
*H01J 61/16* (2006.01)
*H01L 21/66* (2006.01)
*H01J 61/90* (2006.01)
*H01L 21/324* (2006.01)

(52) U.S. Cl.
CPC ...... *H01L 21/324* (2013.01); *H01L 21/67248* (2013.01); *H01L 21/68714* (2013.01); *H01L 22/20* (2013.01)

(56) References Cited

U.S. PATENT DOCUMENTS

| | | | | |
|---|---|---|---|---|
| 9,741,576 | B2* | 8/2017 | Aoyama | H01L 21/2686 |
| 9,799,517 | B2* | 10/2017 | Tanimura | H01L 21/67115 |
| 10,121,683 | B2* | 11/2018 | Aoyama | H01L 21/67115 |
| 10,319,616 | B2* | 6/2019 | Ueda | H01L 21/68735 |
| 10,446,397 | B2* | 10/2019 | Aoyama | H01L 21/2686 |
| 10,559,482 | B2* | 2/2020 | Ito | H01L 21/68735 |
| 2006/0255017 | A1* | 11/2006 | Markle | G01J 5/58 219/121.62 |
| 2014/0206108 | A1* | 7/2014 | Kiyama | H01L 21/67248 438/5 |
| 2016/0195333 | A1* | 7/2016 | Kawarazaki | H01L 21/02247 438/761 |
| 2017/0011923 | A1* | 1/2017 | Tanimura | H05B 3/0047 |
| 2017/0125312 | A1* | 5/2017 | Ono | H01L 21/67248 |
| 2017/0178979 | A1* | 6/2017 | Furukawa | H01L 21/67115 |
| 2017/0194220 | A1* | 7/2017 | Lieberer | H01L 21/67248 |
| 2018/0358234 | A1* | 12/2018 | Ono | H01L 21/67248 |

FOREIGN PATENT DOCUMENTS

| | | |
|---|---|---|
| KR | 100856432 B1 | 9/2008 |
| KR | 10-2018-0030231 A | 3/2018 |
| WO | 2017/116685 A1 | 7/2017 |

OTHER PUBLICATIONS

Korean Notification of Reason for Refusal issued in corresponding Korean Patent Application No. 10-2019-0071418, dated Jul. 1, 2020, with Engish translation.
Korean Notice of Decision to Grant of Patent issued in corresponding Korean Patent Application No. 10-2019-0071418, daed Dec. 23, 2020, with English translation.

* cited by examiner

F I G. 11
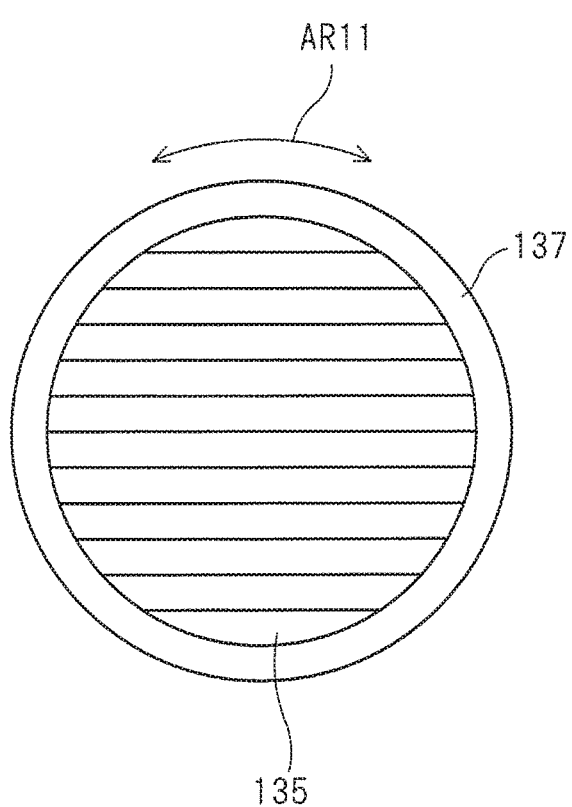

LIGHT IRRADIATION TYPE HEAT TREATMENT APPARATUS

BACKGROUND OF THE INVENTION

Field of the Invention

The present invention relates to a heat treatment apparatus which irradiates a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash tamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature in an extremely short time, thereby achieving only the activation of the impurities without deep diffusion of the impurities.

U.S. Patent Application Publication No. 2017/0125312 discloses a flash lamp annealer which preheats a semiconductor wafer by means of halogen lamps disposed under a chamber, and thereafter irradiates a surface of the semiconductor wafer with a flash of light from flash lamps disposed over the chamber. In the flash lamp annealer disclosed in U.S. Patent Application Publication No. 2017/0125312, a susceptor made of quartz which holds a semiconductor wafer is preheated by irradiation with light from the halogen lamps prior to the treatment of the first semiconductor wafer in a lot for the purpose of providing a uniform temperature history for wafers.

U.S. Patent Application Publication No. 2017/0194220 discloses that preheating is performed while a wafer is held on a susceptor. This technique is capable of efficiently raising the temperature of the susceptor because the susceptor is heated also by heat transfer from the wafer.

In the techniques disclosed in U.S. Patent Application Publication No. 2017/0125312 and U.S. Patent Application Publication No. 2017/0194220, a radiation thermometer is used to measure the temperature of the susceptor in a non-contacting manner for the purpose of preheating the susceptor. However, the preheating with the wafer held on the susceptor as disclosed in U.S. Patent Application Publication No. 2017/0194220 makes it difficult to measure the temperature of the susceptor although the heating efficiency of the susceptor is improved. Specifically, the radiation thermometer receives infrared radiation emitted from an object to be measured to measure the temperature of the object, based on the intensity of the received infrared radiation. When the wafer is held on the susceptor, the radiation thermometer receives infrared radiation emitted from the wafer and transmitted through the susceptor in addition to the infrared radiation emitted from the susceptor. This makes it difficult for the radiation thermometer to accurately measure the temperature of the susceptor.

SUMMARY

The present invention is intended for a heat treatment apparatus for heating a substrate by irradiating the substrate with light.

According to one aspect of the present invention, the heat treatment apparatus comprises: a chamber for receiving a substrate therein; a susceptor made of quartz for placing and holding the substrate thereon within the chamber; a light irradiator for irradiating the substrate held by the susceptor with light; and a first radiation thermometer for measuring the temperature of the susceptor, the first radiation thermometer receiving infrared radiation of a wavelength longer than 4 μm to measure the temperature of the susceptor.

The infrared radiation emitted from the substrate is blocked by the susceptor. The temperature of the susceptor is accurately measured, regardless of whether or not a substrate is held by the susceptor.

Preferably, the heat treatment apparatus further comprises a second radiation thermometer for measuring the temperature of the substrate held by the susceptor. The controller is configured to control the output from the light irradiator, based on the temperature of the susceptor measured with the first radiation thermometer, after controlling the output from the light irradiator, based on the temperature of the substrate measured with the second radiation thermometer.

The controller controls the output from the light irradiator, based on the temperature of the substrate which increases earlier, and thereafter controls the output from the light irradiator, based on the temperature of the susceptor. Thus, the controller is capable of properly controlling the output from the light irradiator.

Preferably, the heat treatment apparatus further comprises a polarization element provided between the susceptor and the first radiation thermometer. The first radiation thermometer is provided in a position lying along the direction of travel of light reflected upon being incident on a surface of the susceptor at a Brewster's angle. The polarization element allows only p polarized light to pass therethrough.

This cuts off the reflected light to allow the radiation thermometer to receive only infrared radiation emitted from the susceptor itself. Thus, the radiation thermometer is able to exclude the influence of the reflected light to measure the temperature of the susceptor more accurately.

It is therefore an object of the present invention to accurately measure the temperature of a susceptor, regardless of whether or not a substrate is held by the susceptor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a view showing the adjustment of the angle of a polarization element by means of an angle adjusting mechanism.

DESCRIPTION OF THE PREFERRED EMBODIMENTS

Preferred embodiments according to the present invention will now be described in detail with reference to the drawings.

First Preferred Embodiment

Figure 1:
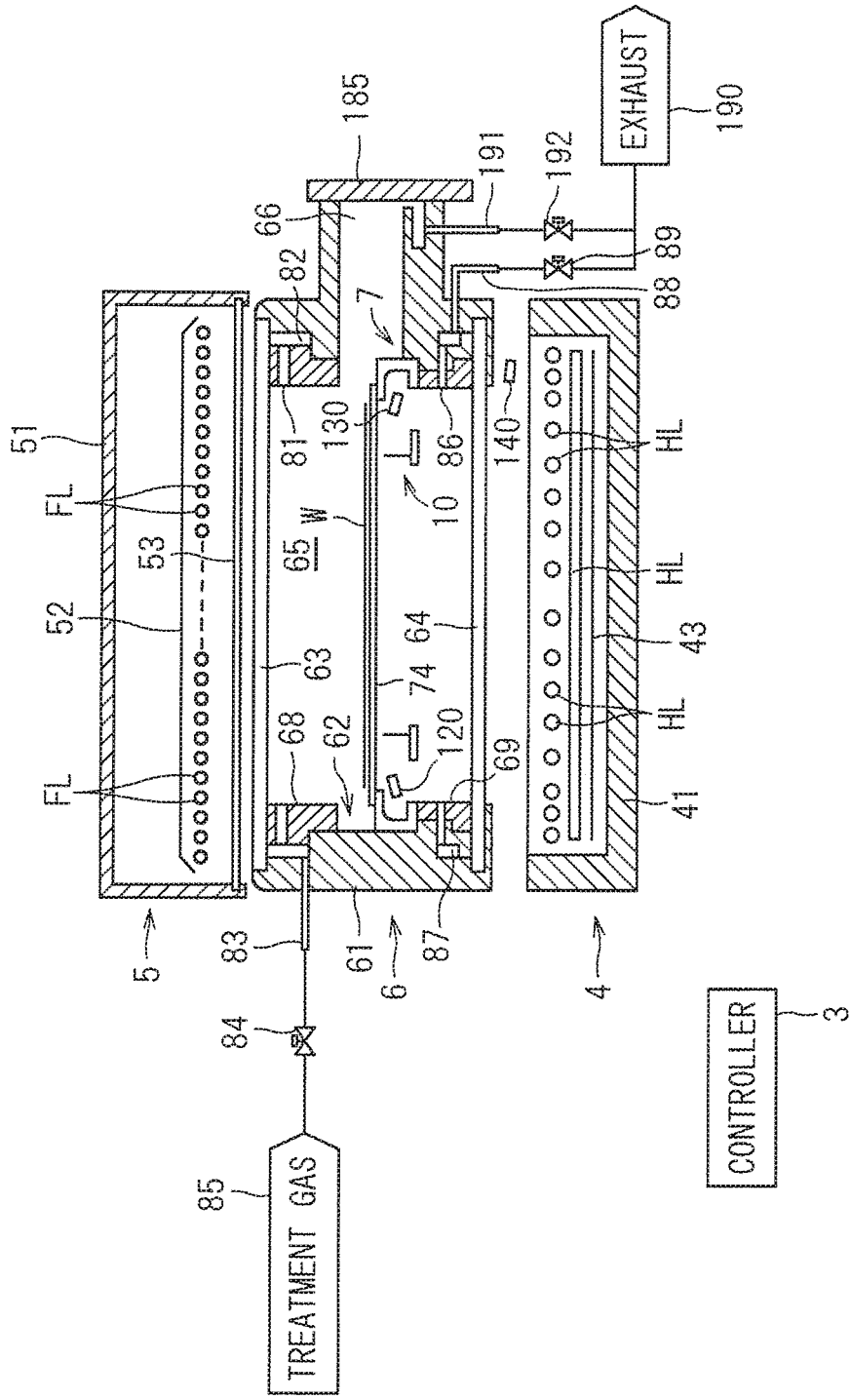
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

A vacuum pump and a utility exhaust system in a factory in which the heat treatment apparatus 1 is installed may be used as the exhaust part 190. When a vacuum pump is employed as the exhaust part 190 to exhaust the atmosphere provided in the heat treatment space 65 which is an enclosed space while no gas is supplied from the gas supply opening 81 by closing the valve 84, the atmosphere provided in the chamber 6 is reduced in pressure to a vacuum atmosphere. When the vacuum pump is not used as the exhaust part 190, the pressure of the atmosphere provided in the chamber 6 is reduced to a pressure lower than atmospheric pressure by exhausting the atmosphere provided in the heat treatment space 65 while the gas is not supplied from the gas supply opening 81.

Figure 2:
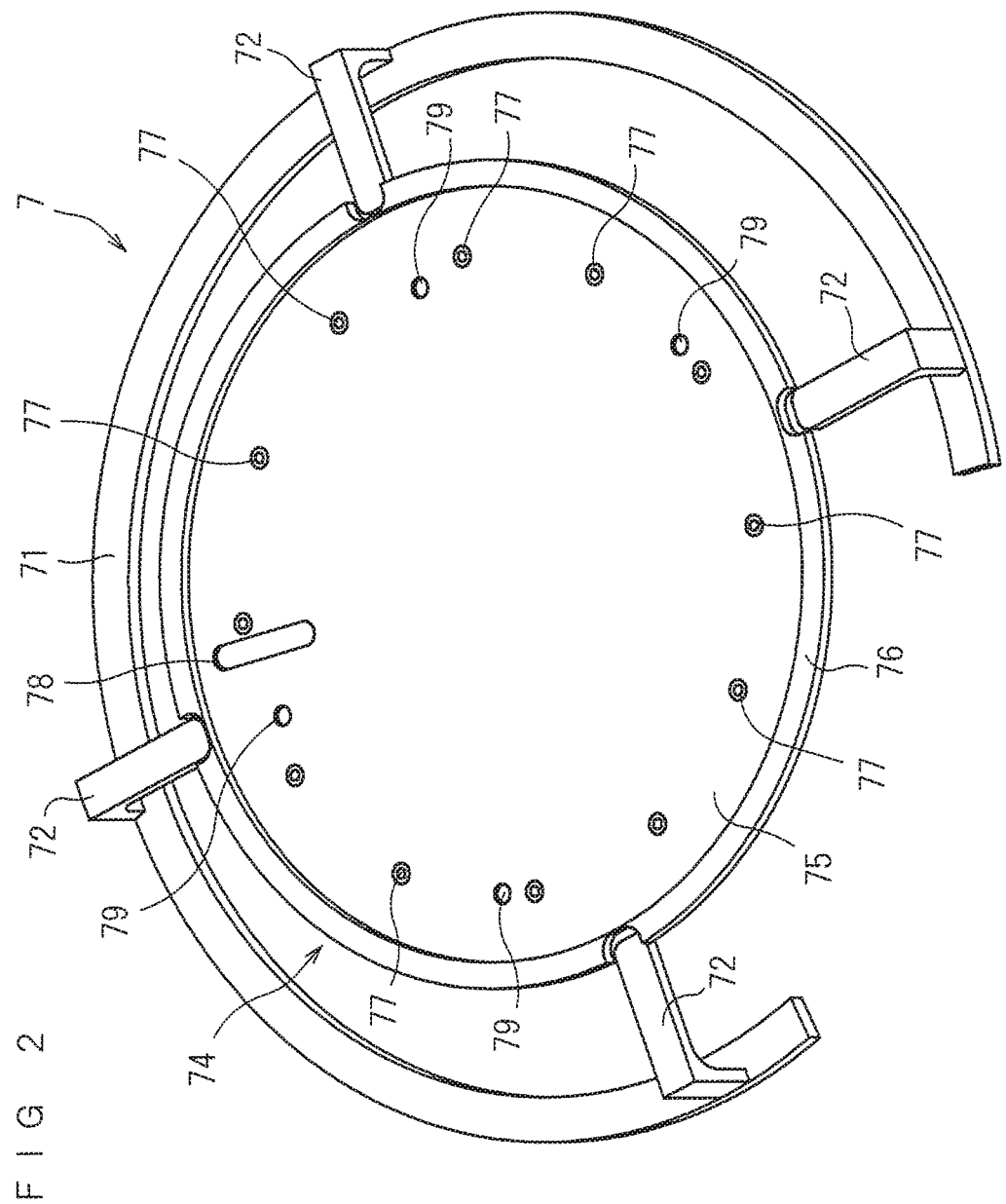
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference be ween transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
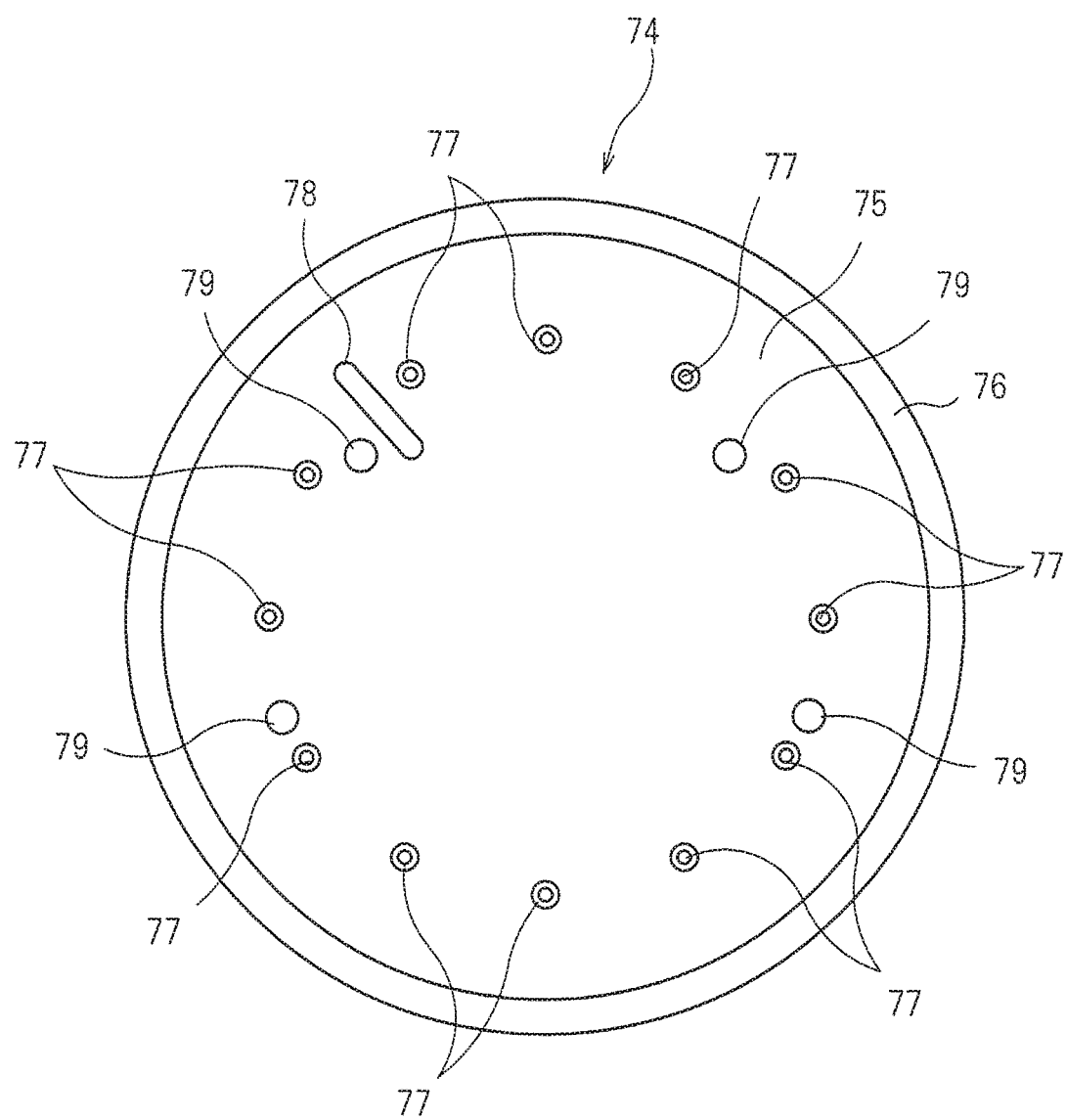
FIG. 3 is a plan view of a susceptor.
Figure 4:
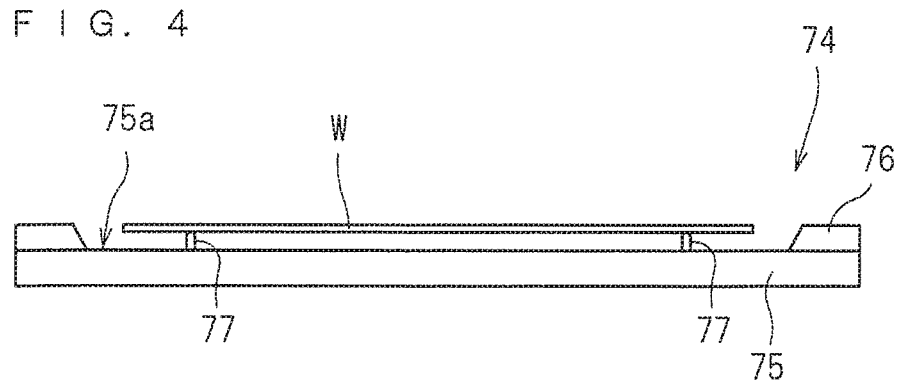
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from lower surface of the semiconductor wafer W. Specifically, the radiation thermometer 120 receives the radiation emitted from the lower surface of the semiconductor wafer W through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
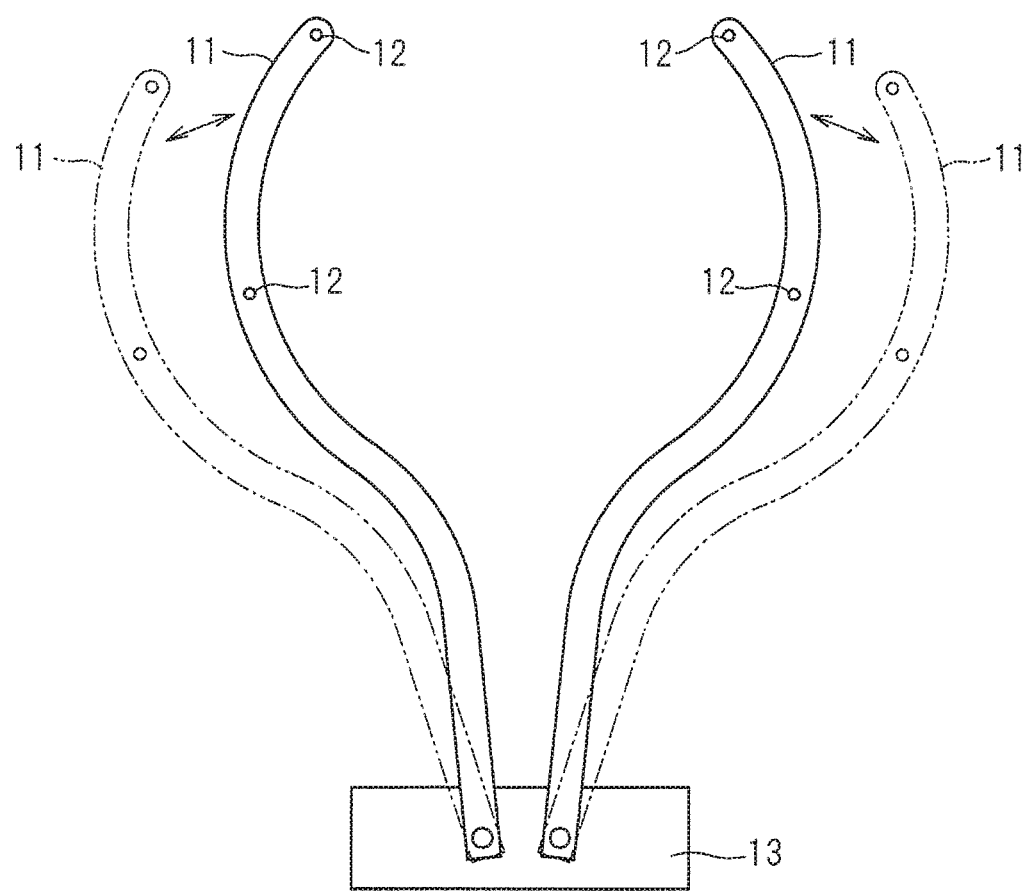
FIG. 5 is a plan view of a transfer mechanism.
Figure 6:
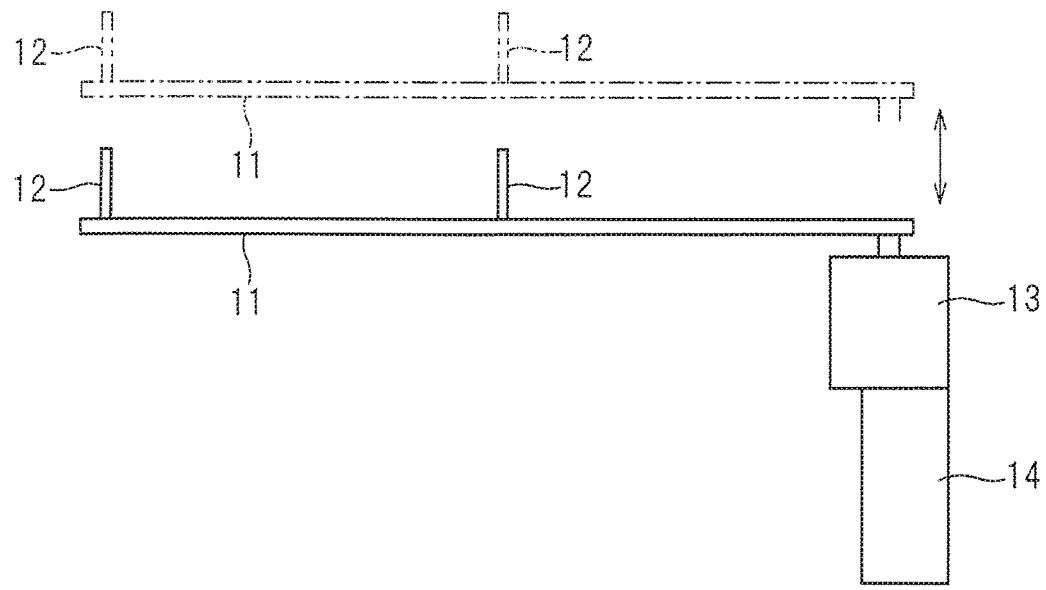
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, the heat treatment apparatus 1 includes three radiation thermometers 120, 130, and 140. As mentioned above, the radiation thermometer 120 measures the temperature of the semiconductor wafer W through the opening 78 provided in the susceptor 74. The radiation thermometer 130 senses infrared radiation emitted from the susceptor 74 made of quartz to measure the temperature of the susceptor 74. The radiation thermometer 140, on the other hand, senses infrared radiation emitted from the lower chamber window 64 to measure the temperature of the lower chamber window 64. The radiation thermometers 120, 130, and 140 are provided obliquely below the respective objects to be measured, i.e. the semiconductor wafer W, the susceptor 74, and the lower chamber window 64, respectively. That is, the angle formed by the optical axis of each of the radiation thermometers 120, 130, and 140 and a corresponding one of the objects to be measured is less than 90 degrees. This is to prevent the radiation thermometers 120, 130, and 140 from blocking the light emitted from the halogen lamps HL and the flash lamps FL.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy, A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
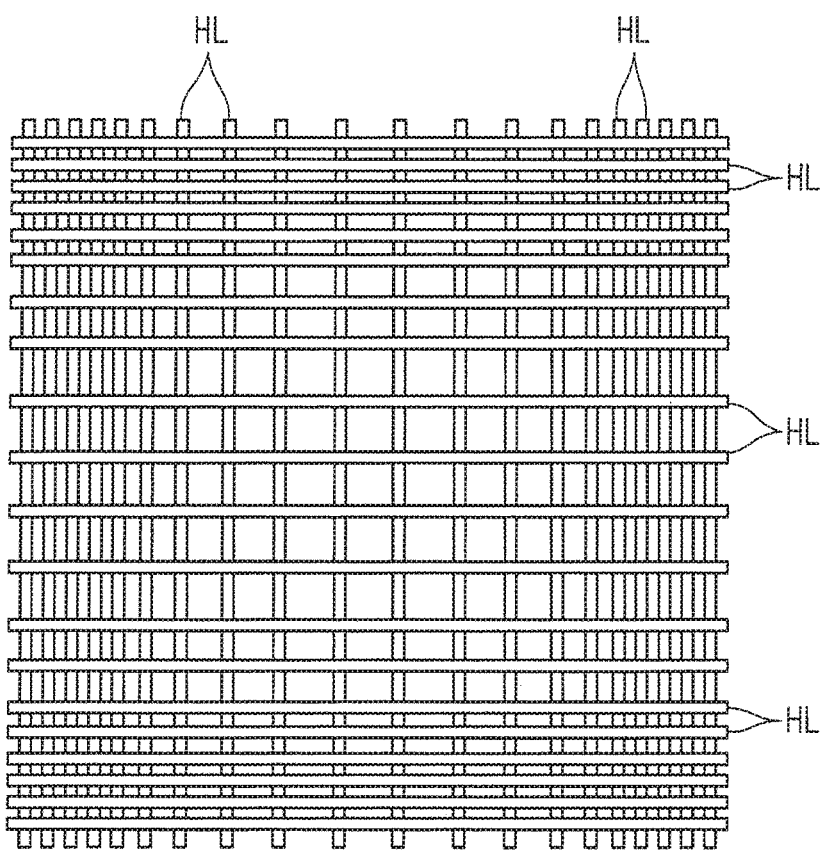
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen amps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment operation in the heat treatment apparatus 1 will be described. First, a procedure for the heat treatment of a semiconductor wafer W to be treated will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by means of flash irradiation. The procedure for the treatment of the semiconductor wafer W which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then be exhausted from a lower portion of the heat treatment space 65. The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 1 of the transfer mechanism 10, which are retracted to the inside of the recessed portion 62, do not become an obstacle to the heating using the halogen lamps HL.

The temperature of the semiconductor wafer W is measured with the radiation thermometer 120 when the halogen lamps HL perform the preheating. Specifically, the radiation thermometer 120 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 120. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 120 reaches the preheating temperature T1, the controller 3 adjusts the output from the halogen lamps HL to maintain the temperature of the semiconductor wafer W at approximately the preheating temperature T1.

The flash lamps FL in the flash heating part 5 irradiate the front surface of the semiconductor wafer W held by the susceptor 74 with a flash of light at the point in time when a predetermined time period has elapsed since temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The radiation thermometer 120 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Typically, the treatment of semiconductor wafers W is performed on a lot-by-lot basis. The term "lot" refers to a group of semiconductor wafers W subjected to the same treatment under the same condition. In the heat treatment apparatus 1 according to the present preferred embodiment, multiple (e.g., 25) semiconductor wafers W in a lot are sequentially transported one by one into the chamber 6 and subjected to the heating treatment.

For the start of the treatment of a lot in the heat treatment apparatus 1 that has not performed the treatment for some period of time, the first semiconductor wafer W in the lot is transported into the chamber 6 that is at approximately room temperature and is then subjected to the flash heating treatment. Examples of this case are such that the heat treatment apparatus 1 starts up after maintenance and then treats the first lot and such that a long time period has elapsed since the treatment of the preceding lot. During the heating treatment, heat transfer occurs from the semiconductor wafer W increased in temperature to in-chamber structures (structures in the chamber) including the susceptor 74 and the like. For this reason, the temperature of the susceptor 74 that is initially at room temperature increases gradually due to heat storage as the number of treated semiconductor wafers W increases. Also, part of infrared radiation emitted from the halogen lamps HL is absorbed by the lower chamber window 64. For this reason, the temperature of the lower chamber window 64 increases gradually as the number of treated semiconductor wafers W increases.

When the heating treatment is performed on approximately ten semiconductor wafers W, the temperatures of the susceptor 74 and the lower chamber window 64 reach a constant stabilized temperature. In the susceptor 74 the temperature of which reaches the stabilized temperature, the amount of heat transferred from the semiconductor wafer W to the susceptor 74 and the amount of heat dissipated from the susceptor 74 are balanced with each other. Before the temperature of the susceptor 74 reaches the stabilized temperature, the amount of heat transferred from the semiconductor wafer W to the susceptor 74 is greater than the amount of heat dissipated from the susceptor 74, so that the temperature of the susceptor 74 increases gradually due to heat storage as the number of treated semiconductor wafers W increases. On the other hand, after the temperature of the susceptor 74 reaches the stabilized temperature, the amount of heat transferred from the semiconductor wafer W to the susceptor 74 and the amount of heat dissipated from the susceptor 74 are balanced with each other, so that the temperature of the susceptor 74 is maintained at the constant stabilized temperature. After the temperature of the lower chamber window 64 reaches the stabilized temperature, the amount of heat that the lower chamber window 64 absorbs from the light emitted from halogen lamps HL and the amount of heat released from the lower chamber window 64 are balanced with each other, so that the temperature of the lower chamber window 64 is also maintained at the constant stabilized temperature.

If the treatment is started in the chamber 6 that is at room temperature in this manner, there has been a problem that a non-uniform temperature history results from a difference in temperature of the structures in the chamber 6 between initial semiconductor wafers W in the lot and intermediate semiconductor wafers W in the lot. Also, there have been cases in which wafer warpage occurs in the initial semiconductor wafers W because the flash heating treatment is performed on the initial semiconductor wafers W supported by the susceptor 74 that is at a low temperature. To solve these problems, dummy running has been hitherto performed prior to the start of the treatment of a lot. The dummy running is a conventional technique in which dummy wafers not to be treated are transported into the chamber 6, and the preheating and the flash heating treatment similar to those for the semiconductor wafers W to be treated are performed on the dummy wafers, whereby the temperature of the in-chamber structures including the susceptor 74, the lower chamber window 64, and the like is increased to the stabilized temperature. Such dummy running not only consumes the dummy wafers irrelevant to the treatment but also requires a considerable amount of time for the flash heating treatment of approximately ten dummy wafers. Thus, the dummy running hinders the efficient operation of the heat treatment apparatus 1.

Figure 8:
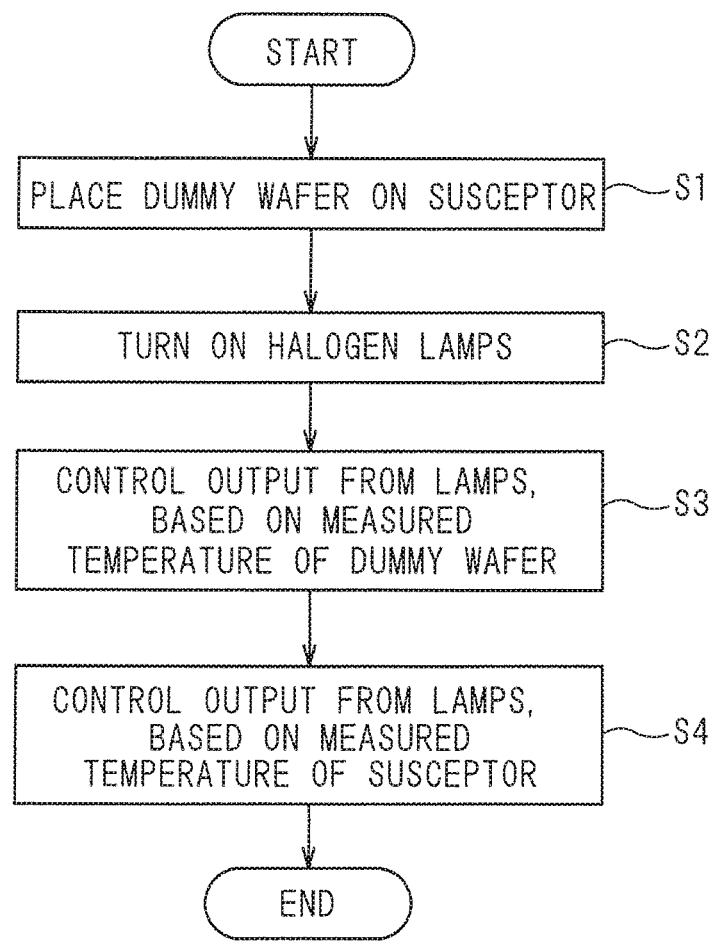
FIG. 8 is a flow diagram showing a procedure for preheating of the susceptor.
Figure 9:
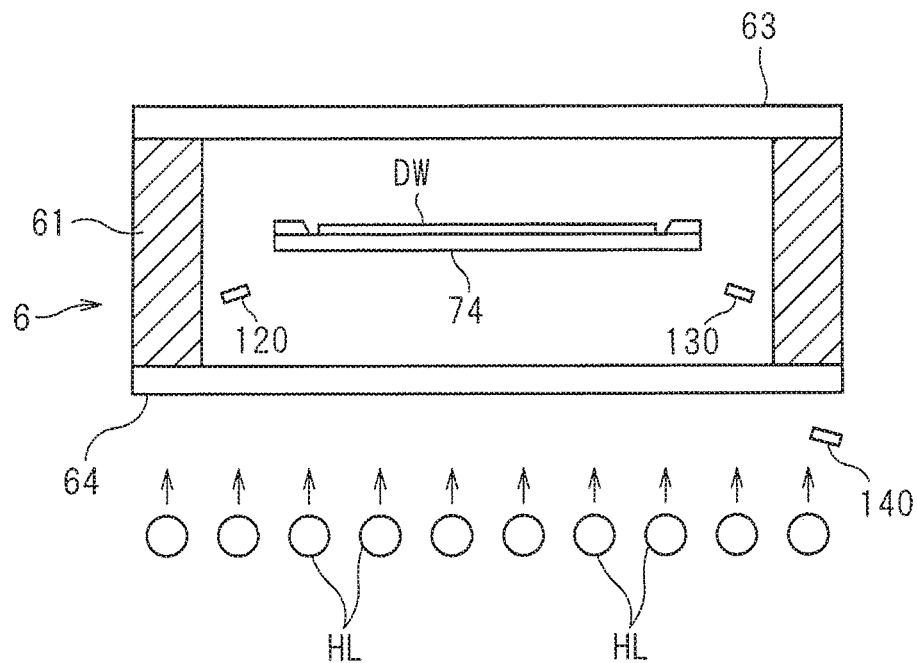
FIG. 9 is a schematic view showing the preheating of the susceptor.

In the first preferred embodiment, preheating is performed on the structures in the chamber 6, such as the susceptor 74, before the first semiconductor wafer W in a lot is transported into the chamber 6. FIG. 8 is a flow diagram showing a procedure for the preheating of the susceptor 74. FIG. 9 is a schematic view showing the preheating of the susceptor 74.

First, a dummy wafer DW is transported into the chamber 6 and is placed on the susceptor 74 (Step S1). The dummy wafer DW is a disk-shaped silicon wafer similar to the semiconductor wafer W to be treated, and is similar in size and shape to the semiconductor wafer W. The dummy wafer DW, however, is neither patterned nor implanted with ions. A procedure for the transport of the dummy wafer DW into the chamber 6 is the same as the aforementioned procedure for the transport of the semiconductor wafer W into the chamber 6. Specifically, the transport robot outside the heat treatment apparatus 1 transports the dummy wafer DW into the chamber 6, and the lift pins 12 of the transfer mechanism 10 receive the dummy wafer DW. Then, the lift pins 12 move downwardly, whereby the dummy wafer DW is placed and held on the susceptor 74.

After the dummy wafer DW is held by the susceptor 74, the halogen lamps HL in the halogen heating part 4 turn on (Step S2). Although part of the light emitted from the halogen lamps HL is absorbed by the lower chamber window 64 and the susceptor 74 both made of quartz, most of the light emitted from the halogen lamps HL is absorbed by the dummy wafer DW. Thus, the temperature of the dummy wafer DW is increased earlier than the temperature of the susceptor 74 by the irradiation with light from the halogen lamps HL. Then, the susceptor 74 is preheated by the heat transfer from the dummy wafer DW. If the dummy wafer DW is absent, the temperature of the susceptor 74 increases at a significantly low rate because the quartz susceptor 74 is heated only by the absorption of light emitted from the halogen lamps HL. The irradiation with light from the halogen lamps HL, with the dummy wafer DW held by the susceptor 74, allows the quartz susceptor 74 to be efficiently and speedily preheated by the heat transfer from the dummy wafer DW the temperature of which increases earlier.

The temperature of the dummy wafer DW is measured with the radiation thermometer 120 when the preheating of the susceptor 74 holding the dummy wafer DW is performed. Also, the temperature of the susceptor 74 is measured with the radiation thermometer 130, and the temperature of the lower chamber window 64 is measured with the radiation thermometer 140.

For some period of time after the turning on of the halogen lamps HL, i.e. in an early stage of the preheating of the susceptor 74, the controller 3 controls the output from the halogen lamps HL, based on the measured temperature of the dummy wafer DW (Step S3). In Step S3, the radiation thermometer 120 receives infrared radiation emitted from the lower surface of the dummy wafer DW held by the susceptor 74 through the opening 78 to measure the temperature of the dummy wafer DW. The measured temperature of the dummy wafer DW is transmitted to the controller 3. The controller 3 controls the output from the halogen lamps HL while monitoring whether the temperature of the dummy wafer DW reaches a predetermined set temperature or not. In other words, the controller 3 effects feedback control of the output from the halogen lamps HL, based on the temperature of the dummy wafer DW measured with the radiation thermometer 120.

After the temperature of the dummy wafer DW reaches the predetermined set temperature, the controller 3 controls the output from the halogen lamps HL, based on the measured temperature of the susceptor 74 (Step S4). In Step S4, the radiation thermometer 130 receives infrared radiation emitted from the susceptor 74 being preheated to measure the temperature of the susceptor 74. The radiation thermometer 130 receives infrared radiation of a wavelength longer than 4 μm to measure the temperature of the susceptor 74. Specifically, the radiation thermometer 130 may be provided with a filter for blocking light of a wavelength not longer than 4 μm, for example. Alternatively, the radiation thermometer 130 may include a detection element for detecting a wavelength range longer than 4 μm.

Quartz has the properties of being high in transmittance in a wavelength range not longer than 4 μm but being significantly low in transmittance in a wavelength range longer than 4 μm. In other words, quarts is transparent in a wavelength range not longer than 4 μm but is opaque in a wavelength range longer than 4 μm. Thus, when measuring the temperature of the susceptor 74 made of quartz in a wavelength range not longer than 4 μm, a radiation thermometer receives infrared radiation emitted from the dummy wafer DW and transmitted through the susceptor 74 in addition to infrared radiation emitted from the susceptor 74 to fail to accurately measure the temperature of the susceptor 74. In the first preferred embodiment, the radiation thermometer 130 receives infrared radiation of a wavelength longer than 4 μm to measure the temperature of the susceptor 74. Infrared radiation of a wavelength longer than 4 μm emitted from the dummy wafer DW is blocked by the susceptor 74 because quartz is opaque in a wavelength range longer than 4 μm. As a result, the radiation thermometer 130 is able to receive only infrared radiation emitted from the susceptor 74 to accurately measure the temperature of the susceptor 74.

The temperature of the susceptor 74 measured with the radiation thermometer 130 is transmitted to the controller 3. The controller 3 controls the output from the halogen lamps HL while monitoring whether the temperature of the susceptor 74 reaches a stabilized temperature or not. In other words, the controller 3 effects feedback control of the output from the halogen lamps HL so that the temperature of the susceptor 74 is equal to the stabilized temperature, based on the measured temperature of the susceptor 74 acquired by the radiation thermometer 130. The stabilized tempera re the temperature of the susceptor 74 obtained when heating of a plurality of semiconductor wafers W in a lot in succession within the chamber 6 by irradiation with light without preheating of the susceptor 74 causes the temperature of the susceptor 74 to increase to a constant temperature.

After the temperature of the susceptor 74 reaches the stabilized temperature, the dummy wafer DW is transported out of the chamber 6, and the first semiconductor water W to be treated in a lot is transported into the chamber 6 and subjected to the aforementioned heat treatment. The susceptor 74 and the like are already heated to the stabilized temperature when the first semiconductor wafer W to be treated in the lot is transported into the chamber 6. This provides a uniform temperature history for all of the semiconductor wafers W in the lot. Also, initial semiconductor wafers W in the lot are held by the susceptor 74 the temperature of which is increased to the stabilized temperature. This prevents wafer warpage resulting from a temperature difference between the susceptor 74 and the initial semiconductor wafers W.

In the first preferred embodiment, the radiation thermometer 130 receives infrared radiation of a wavelength longer than 4 μm to measure the temperature of the susceptor 74 made of quartz. The radiation thermometer 130 is able to receive only infrared radiation emitted from the susceptor 74 to accurately measure the temperature of the susceptor 74, regardless of whether or not a wafer is held by the susceptor 74, because quartz is opaque in a wavelength range longer than 4 μm.

In the first preferred embodiment, the controller 3 controls the output from the halogen lamps HL, based on the temperature of the dummy wafer DW measured with the radiation thermometer 120, in the early stage of the preheating of the susceptor 74, and thereafter controls the output from the halogen lamps HL, based on the temperature of the susceptor 74 measured with the radiation thermometer 130. In the early stage of the preheating of the susceptor 74, the temperature of the dummy wafer DW increases earlier but the temperature of the susceptor 74 increases very little. For this reason, there is a danger that the output from the halogen lamps HL becomes excessively high if the controller 3 controls the output from the halogen lamps HL, based on the temperature of the susceptor 74. To prevent this, it is preferable that the controller 3 controls the output from the halogen lamps HL, based on the measured temperature of the dummy wafer DW, in the early stage of the preheating of the susceptor 74.

On the other hand, it is difficult to accurately increase the temperature of the susceptor 74 to the stabilized temperature if the controller 3 controls the output from the halogen lamps HL, based on only the measured temperature of the dummy wafer DW. It is hence preferable that the controller 3 controls the output from the halogen lamps HL, based on the measured temperature of the susceptor 74, after the temperature of the susceptor 74 is increased to some degree by the heat transfer from the dummy wafer DW the temperature of which increases earlier. That is, the output from the halogen lamps HL is properly controlled by the process performed as in the first preferred embodiment.

Second Preferred Embodiment

Next, a second preferred embodiment according to the present invention will be described. The second preferred embodiment is substantially similar in configuration of the heat treatment apparatus 1 and in procedure for treatment of the semiconductor wafer W to the first preferred embodiment. In the first preferred embodiment, the temperature of the susceptor 74 is measured with the radiation thermometer 130 for the purpose of controlling the output from the halogen lamps HL during the preheating. In the first preferred embodiment, the temperature of the semiconductor wafer W is also measured with the radiation thermometer 120 for the purpose of controlling the output from the halogen lamps HL during the heat treatment of the semiconductor wafer W. Further, the temperature of the lower chamber window 64 is measured with the radiation thermometer 140.

The radiation thermometers 120, 130, and 140 receive infrared radiation emitted from the semiconductor wafer W, the susceptor 74, and the lower chamber window 64, respectively, to measure the temperatures of the respective objects to be measured, based on the intensity of the received infrared radiation. However, the main surfaces of the semiconductor wafer W and the front surfaces of the quartz members, which are mirror surfaces, reflect infrared radiation emitted from the periphery, so that the reflected radiation reaches the radiation thermometers 120, 130, and 140. In other words, the radiation thermometers 120, 130, and 140 receive the radiation reflected from the objects to be measured in addition to the infrared radiation emitted from the objects to be measured. This causes measurement errors. For example, the radiation thermometer 130 receives infrared radiation emitted from the inner wall surface of the chamber 6 and the like and reflected from a surface of the susceptor 74 in addition to the infrared radiation emitted from the susceptor 74. This constitutes a hindrance to the accurate measurement of the temperature of the susceptor 74.

Figure 10:
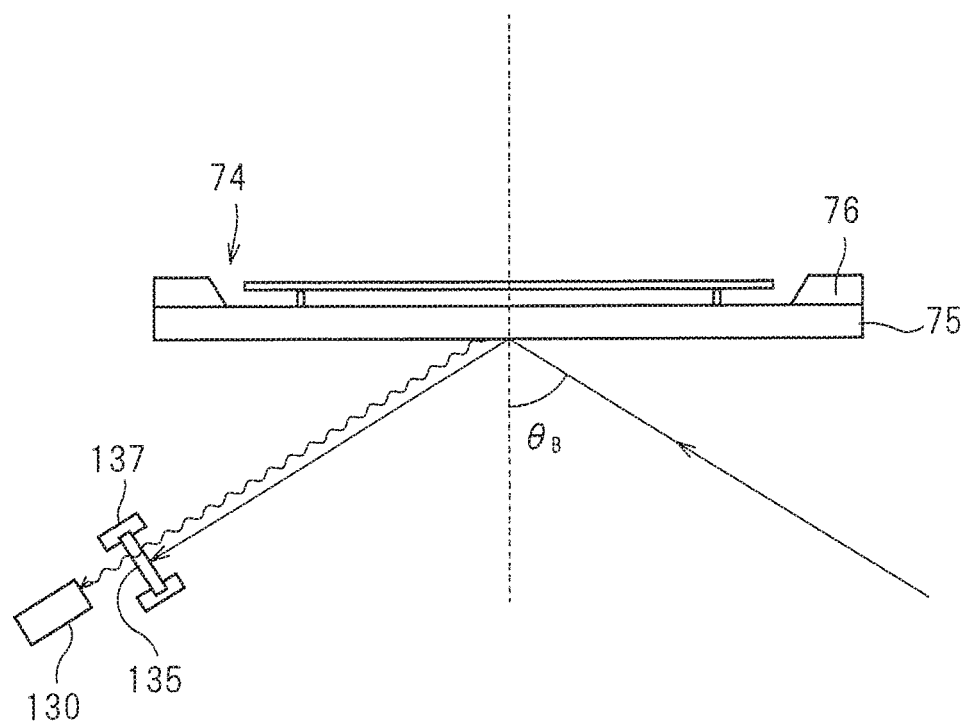
FIG. 10 is a schematic view showing the measurement of the temperature of the susceptor by means of a radiation thermometer.

To prevent this, the second preferred embodiment performs temperature measurements with the radiation thermometers in a manner to be described below. FIG. 10 is a schematic view showing the measurement of the temperature of the susceptor 74 by means of the radiation thermometer 130. The radiation thermometer 130 is provided obliquely below the susceptor 74 made of quartz. More precisely, the radiation thermometer 130 is provided in a position lying along the direction of travel of light reflected upon being incident on the surface of the susceptor 74 at a Brewster's angle $\theta_B$. The Brewster's angle $\theta_B$ is an incidence angle at which the reflectance of p polarized light goes to zero at an interface between materials with different refractive indices. The reflection angle of the light incident at the Brewster's angle $\theta_B$ is also equal to the Brewster's angle $\theta_B$ because the incidence angle is equal to the reflection angle. In other words, the radiation thermometer 130 is placed so that the angle formed by the optical axis of the radiation thermometer 130 and the normal to the susceptor 74 is equal to the Brewster's angle $\theta_B$.

A polarization element 135 is provided between the susceptor 74 and the radiation thermometer 130. The polarization element 135 is an element which allows only light polarized in a particular direction to pass therethrough. For example, a wire grid polarization element including a large number of aluminum wires arranged in parallel may be used as the polarization element 135. The polarization element 135 allows only p polarized to selectively pass therethrough, and reflects s polarized light. The p polarized light is polarized light with an electric field oscillating in an incidence plane, and the s polarized light is polarized light with an electric field oscillating perpendicularly to an incidence plane.

Further provided is an angle adjusting mechanism 137 for adjusting the rotation angle of the polarization element 135 with respect to the optical axis of light reflected toward the radiation thermometer 130 upon being incident on the surface of the susceptor 74 at the Brewster's angle $\theta_B$. FIG. 11 is a view showing the adjustment of the angle of the polarization element 135 by means of the angle adjusting mechanism 137. With reference to FIG. 11, the optical axis of the light reflected upon being incident on the surface of the susceptor 74 at the Brewster's angle $\theta_B$ is perpendicular to the plane of FIG. 11. An operator of the heat treatment apparatus 1 uses the angle adjusting mechanism 137 to adjust the rotation angle of the polarization element 135 in a direction indicated by the arrow AR11 of FIG. 11. Such adjustment of the angle of the polarization element 135 is performed as a fine adjustment for correction of differences between apparatuses.

Referring again to FIG. 10, the light reflected upon being incident on the surface of the susceptor 74 at the Brewster's angle $\theta_B$ (light directed from the susceptor 74 toward the radiation thermometer 130 and indicated by a straight line in FIG. 10) includes no p polarized light. On the other hand, the infrared radiation emitted from the susceptor 74 itself (light indicated by a wiggly line in FIG. 10) can be construed as combined light comprised of the p polarized light and the s polarized light. That is, the p polarized light and the s polarized light are mixed in the infrared radiation emitted from the susceptor 74.

The polarization element 135 which allows only the p polarized light to selectively pass therethrough is provided between the susceptor 74 and the radiation thermometer 130. Both the light reflected upon being incident on the surface of the susceptor 74 at the Brewster's angle $\theta_B$ and the infrared radiation emitted from the susceptor 74 itself enter the polarization element 135. At this time, the light reflected upon being incident on the surface of the susceptor 74 at the Brewster's angle $\theta_B$ cannot pass though the polarization element 135 which allows only the p polarized light to pass therethrough because this reflected light includes no p polarized light. In other words, the light reflected from the susceptor 74 is blocked by the polarization element 135. On the other hand, since the p polarized light and the s polarized light are mixed in the infrared radiation emitted from the susceptor 74 itself, the p polarized light passes through the polarization element 135 to reach the radiation thermometer 130. That is, the radiation thermometer 130 is able to receive the infrared radiation emitted from the susceptor 74 itself and passing through the polarization element 135.

In this manner, the radiation thermometer 130 is provided in a position lying along the direction of travel of the light reflected upon being incident on the surface of the susceptor 74 at the Brewster's angle $\theta_B$, and the polarization element 135 which allows only the p polarized light to pass therethrough is provided between the susceptor 74 and the radiation thermometer 130. This cuts off the reflected light allow the radiation thermometer 130 to receive only the infrared radiation emitted from the susceptor 74 itself. As a result, the radiation thermometer 130 is able to exclude the influence of the reflected light to measure the temperature of the susceptor 74 that is an object to be measured more accurately.

Although the measurement of the temperature of the susceptor 74 by means of the radiation thermometer 130 has been described hereinabove, measurements by means of the radiation thermometers 120 and 140 are also performed in the same manner. Specifically, the radiation thermometer 120 is provided in a position lying along the direction of travel of light reflected upon being incident on a main surface of the semiconductor wafer W held by the susceptor 74 at a Brewster's angle $\theta_B$, and a polarization element which allows only the p polarized light to pass therethrough is provided between the semiconductor wafer W and the radiation thermometer 120. This cuts off the reflected light to allow the radiation thermometer 120 to receive only the infrared radiation emitted from the semiconductor wafer W itself. Thus, the radiation thermometer 120 is able to exclude the influence of the reflected light to accurately measure the temperature of the semiconductor wafer W that is an object to be measured.

Also, the radiation thermometer 140 is provided in a position lying along the direction of travel of light reflected upon being incident on a surface of the lower chamber window 64 that is a quartz window at a Brewster's angle $\theta_B$, and a polarization element which allows only the p polarized light to pass therethrough is provided between the lower chamber window 64 and the radiation thermometer 140. This cuts off the reflected light to allow the radiation thermometer 140 to receive only the infrared radiation emitted from the lower chamber window 64 itself. Thus, the radiation thermometer 140 is able to exclude the influence of the reflected light to accurately measure the temperature of the lower chamber window 64 that is an object to be measured.

Modifications

While the preferred embodiments according to the present invention have been described hereinabove, various modifications of the present invention in addition to those described above may be made without departing from the scope and spirit of the invention. In the first preferred embodiment, for example, the controller 3 may control the output from the halogen lamps HL, based on the temperature of the dummy wafer DW, and thereafter control the output from the halogen lamps HL, based on the temperature of the lower chamber window 64 measured with the radiation thermometer 140. Further afterward, the controller 3 may control the output from the halogen lamps HL, based on the temperature of the susceptor 74 measured with the radiation thermometer 130.

Also, a radiation thermometer may be used to measure the temperature of a structure provided in the chamber 6, such as the upper chamber window 63, other than the susceptor 74 and the lower chamber window 64, and the controller 3 may control the output from the halogen lamps HL during the preheating of the susceptor 74, based on the measurement result. In this case, the radiation thermometer is provided in a position lying along the direction of travel of light reflected upon being incident on a surface of the upper chamber window 63 that is a quartz window at a Brewster's angle $\theta_B$, and a polarization element which allows only the p polarized light to pass therethrough is provided between the upper chamber window 63 and the radiation thermometer. This cuts off the reflected light to allow the radiation thermometer to receive only infrared radiation emitted from the upper chamber window 63 itself. Thus, the radiation thermometer is able to exclude the influence of the reflected light to accurately measure the temperature of the object to be measured.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating. In this case, the susceptor 74 is preheated by the irradiation with light from the arc lamps.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. In this case, the technique according to the present invention may be used to measure the temperature of the glass substrate and the like by means of a radiation thermometer. Also, the heat treatment apparatus 1 may perform the heat treatment of high dielectric constant gate insulator films (high-k films), the joining of metal and silicon, and the crystallization of polysilicon.

While the invention has been described in detail, the foregoing description is in all aspects illustrative and not restrictive. It is understood that numerous other modifications and variations can be devised without departing from the scope of the invention.

What is claimed is:
1. A heat treatment apparatus for heating a substrate by irradiating the substrate with light, comprising:
   a chamber for receiving a substrate therein;
   a susceptor made of quartz for placing and holding said substrate thereon within said chamber;
   a light irradiator for irradiating said substrate held by said susceptor with light;
   a first radiation thermometer for measuring the temperature of said susceptor, said first radiation thermometer receiving infrared radiation of a wavelength longer than 4 μm to measure the temperature of said susceptor;

a second radiation thermometer for measuring the temperature of said substrate held by said susceptor, and a controller for controlling light irradiation from said light irradiator, wherein when said susceptor holding a dummy substrate is heated by the light irradiation from said light irradiator, (1) said controller is configured to control an output from said light irradiator based on the temperature of said dummy substrate measured with said second radiation thermometer, and (2) in response to the temperature of said dummy substrate reaching a predetermined set temperature after controlling the output from said light irradiator based on the temperature of said dummy substrate, said controller is configured to control the output from said light irradiator based on the temperature of said susceptor measured with said first radiation thermometer.

2. The heat treatment apparatus according to claim 1, further comprising a polarization element provided between said susceptor and said first radiation thermometer, said first radiation thermometer being provided in a position lying along the direction of travel of light reflected upon being incident on a surface of said susceptor at a Brewster's angle, said polarization element allowing only p polarized light to pass therethrough.

\* \* \* \* \*